(12) United States Patent
Oka et al.

(10) Patent No.: US 8,338,912 B2
(45) Date of Patent: Dec. 25, 2012

(54) INDUCTOR MODULE, SILICON TUNER MODULE AND SEMICONDUCTOR DEVICE

(75) Inventors: Shuichi Oka, Kanagawa (JP); Katsuji Matsumoto, Kanagawa (JP); Shusaku Yanagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 446 days.

(21) Appl. No.: 12/482,022

(22) Filed: Jun. 10, 2009

(65) Prior Publication Data

US 2009/0309185 A1    Dec. 17, 2009

(30) Foreign Application Priority Data

Jun. 12, 2008  (JP) ................................. 2008-153758

(51) Int. Cl.
*H01F 27/06* (2006.01)
*H01F 27/30* (2006.01)
*H01L 21/12* (2006.01)

(52) U.S. Cl. ......... 257/531; 361/816; 361/821; 336/200

(58) Field of Classification Search .................. 257/531; 361/764, 783, 816, 821; 336/200
See application file for complete search history.

(56) References Cited

U.S. PATENT DOCUMENTS

| 2007/0047158 A1* | 3/2007 | Hayashi et al. | .......... 360/324.11 |
| 2008/0012091 A1* | 1/2008 | Ding et al. | ..................... 257/531 |

FOREIGN PATENT DOCUMENTS

| JP | 10-303565 | 11/1998 |
| JP | 2003-197426 | 7/2003 |
| JP | 2003-318549 | 11/2003 |
| JP | 2004-056144 | 2/2004 |
| JP | 2005-034728 | 2/2005 |
| JP | 2006-019342 | 1/2006 |
| JP | 2008-004853 | 1/2008 |

OTHER PUBLICATIONS

Japanese Patent Office Action corresponding to Japanese Serial No. 2008-153758 dated Feb. 2, 2010.

* cited by examiner

*Primary Examiner* — Michael Shingleton
(74) *Attorney, Agent, or Firm* — SNR Denton US LLP

(57) ABSTRACT

Disclosed herein is an inductor module including a substrate functioning as a printed wiring board or an interposer; an IC mounting part formed on a surface of the substrate; an inductor which is formed in the substrate at such a position as to overlap with the IC mounting part on a plan-view basis and which is connected to an IC mounted on the IC mounting part; and a magnetic body including a magnetic material selected from among a NiZn ferrite, a NiZnCu ferrite and a Ba ferrite, the magnetic body being disposed intermediately between the IC mounting part and the inductor.

3 Claims, 3 Drawing Sheets

INDUCTOR MODULE, SILICON TUNER MODULE AND SEMICONDUCTOR DEVICE

BACKGROUND OF THE INVENTION

1. Field of the Invention

The present invention relates to an inductor module, a silicon tuner module and a semiconductor device.

2. Description of the Related Art

In recent years, with the advent of organic electroluminescence (EL) television sets, extra-thin liquid crystal display (LCD) television sets and the like, there is a need for more reductions in the size and thickness of the tuner module, which is one of the largest functional parts in television receivers. In addition, increases in the number of functions such as incorporation of a recording function and a multi-window display mode have been being made, and there are an increasing number of cases where a plurality of tuner modules are mounted in a single television receiver. From this point of view, also, there has been a keener need for smaller-sized tuner modules.

To meet such a need as above, recently, there has been vigorous development of silicon tuner modules in which a television broadcast receiving function is realized by integrating an analog radio frequency (RF) circuit into a device based on a semiconductor such as silicon (Si) or silicon-germanium (SiGe).

Silicon tuner modules can be much reduced in volume, as compared with the so-called "CAN tuners," which are box-type tuner modules in the related art. The large volume of CAN tuners arises from their configuration in which a large number of analog parts such as air-core coils, varactors and diodes with diameters of several millimeters constituting an analog part such as filter are mounted in a shielding metal, in addition to ICs (Integrated Circuit) such as mixer, PLL (Phase-Locked Loop) and the like. On the other hand, in silicon tuner modules, these analog parts are integrated into ICs to thereby realize reductions in size.

Meanwhile, in the case of integrating a filter function into an IC, the diameter of a coil which can be integrated in the IC is as small as several tens of micrometers. In this case, therefore, it is more difficult to enhance the performance of the filter than in the case of the CAN tuner. Specifically, with the filter function incorporated in an IC, it may be very difficult to sufficiently remove unwanted signals or to enhance reception sensitivity.

For solving this problem, a winding inductor (hereinafter referred to simply as "inductor") functioning as a filter may be provided in the module, separately from the functions integrated in the IC, to thereby enhance the reception sensitivity.

It should be noted here, however, that if the inductor is an externally attached part, degradation of inductor characteristics may be caused thereby. The reason for this lies in that when an inductor as an externally attached part is mounted on the IC mounting substrate, the inductor has to be connected to the IC by laying around wire bonding, substrate wiring, or the like. In short, the parasitic resistance, parasitic capacitance, parasitic inductance and the like arising from the laying-around distances of the wiring and the like have adverse effects on the inductor characteristics.

Taking this into consideration, a configuration may be contemplated in which the inductor functioning as a filter is not provided as an externally attached part but is fabricated in the IC mounting substrate, so as to greatly shorten the laying-around distances of the wiring, etc. and thereby to restrain the degradation of inductor characteristics. Specifically, there have been proposals to incorporate an inductor element in a multilayer circuit board (refer to, for example, Japanese Patent Laid-open No. 2003-318549), to reduce noise, crosstalk or adverse effects of stray capacitances by a coil incorporated in the substrate (refer to, for example, Japanese Patent Laid-open No. 2005-347286), or to form a spiral inductor in the interposer in such a manner as to function as a filter (refer to, for example, Japanese Patent Laid-open No. 2008-004853).

SUMMARY OF THE INVENTION

However, when simple shortening of the laying-around distances of wiring and the like is merely adopted, there would arise a problem in that inductor characteristics are lowered under influences of undesired radiation from the ICs. Specifically, although the shortening of the laying-around distances of wiring and the like can restrain the adverse effects of parasitic resistance, parasitic capacitance, parasitic inductance, etc., it results in that the inductor formed to function as a filter is located closer to the IC. Therefore, the inductance is more likely to be influenced by radiation of harmonic components generated from a circuit called a voltage-controlled oscillator (VCO) integrated in the IC, and the inductor characteristics are degraded by the influence of radiation of harmonics (unwanted radiation).

Thus, there is a need for provision of an inductor module, a silicon tuner module and a semiconductor device which can contribute to suppression of adverse effects of unwanted radiation from an IC, while making it possible to suppress the adverse influences of parasitic resistance, parasitic capacitance, parasitic inductance, etc. by shortening the laying-around distances of wiring and the like, in the case where an inductor functioning as a filter is provided in a module separately from the functions integrated in an IC.

According to an embodiment of the present invention, there is provided an inductor module including: a substrate functioning as a printed wiring board or an interposer; an IC mounting part formed on a surface of the substrate; an inductor which is formed in the substrate at such a position as to overlap with the IC mounting part on a plan-view basis and which is connected to an IC mounted on the IC mounting part; and a magnetic body including a magnetic material selected from among a NiZn ferrite, a NiZnCu ferrite and a Ba ferrite, the magnetic body being disposed intermediately between the IC mounting part and the inductor.

In the inductor module configured as above, the inductor is formed in the substrate at such a position as to overlap with the IC mounting part on a plan-view basis. Therefore, the laying-around distances of wiring and the like for securing connection of the inductor with the IC can be made shorter than in the case where the inductor is provided on the substrate as an externally attached part.

In addition, notwithstanding the inductor is formed at such a position as to overlap with the IC mounting part on a plan-view basis, the magnetic body is present intermediately between the IC mounting part and the inductor and, therefore, unwanted radiation from the IC mounted on the IC mounting part is absorbed by an electromagnetic wave absorbing action of the magnetic body. Consequently, bad influences of the unwanted radiation are restrained from being exerted on the inductor. Moreover, since the body present intermediately between the IC mounting part and the inductor is a magnetic body, an L value amplifying action of the magnetic body on the inductor can also be expected.

The L value amplifying action and the electromagnetic wave absorbing action of the magnetic body are displayed through utilization of characteristics of the real part ($\mu'$) and the imaginary part (μ″) of the permeability of the magnetic body. To be more specific, in the frequency band used for the IC, the L value amplifying action is displayed through utilization of the μ′ characteristic of the magnetic body, whereas in the frequency band in which unwanted radiation from the IC might produce a problem, the electromagnetic wave absorbing action is displayed through utilization of the μ″ characteristic of the magnetic body. Besides, the use of a body including a magnetic material selected from among a NiZn ferrite, a NiZnCu ferrite and a Ba ferrite as the magnetic body makes it possible to utilize the μ′ characteristic in the frequency band used for the IC and to utilize the μ″ characteristic in the frequency band in which the unwanted radiation might produce a problem.

According to the embodiments of the present invention, the laying-around distances of wiring and the like for securing connection between the IC (e.g., silicon tuner IC) mounted on the IC mounting part and the inductor formed in the substrate can be shortened, so that it is possible to suppress the adverse effects of parasitic resistance, parasitic capacitance, parasitic inductance, etc. As a result, it is possible to realize suppression of degradation of inductor characteristics. Furthermore, bad influences of unwanted radiation from the ICs mounted on the IC mounting part can be restrained from being exerted on the inductor, by the simple configuration in which the magnetic body including a magnetic material selected from among a NiZn ferrite, a NiZnCu ferrite and a Ba ferrite is intermediately provided between the IC mounting part and the inductor. Thus, the configuration according to an embodiment of the present invention can contribute to suppression of adverse effects of the unwanted radiation from the ICs, even in the case where the laying-around distances of wiring and the like are shortened.

DETAILED DESCRIPTION OF THE PREFERRED EMBODIMENTS

Figure 1:
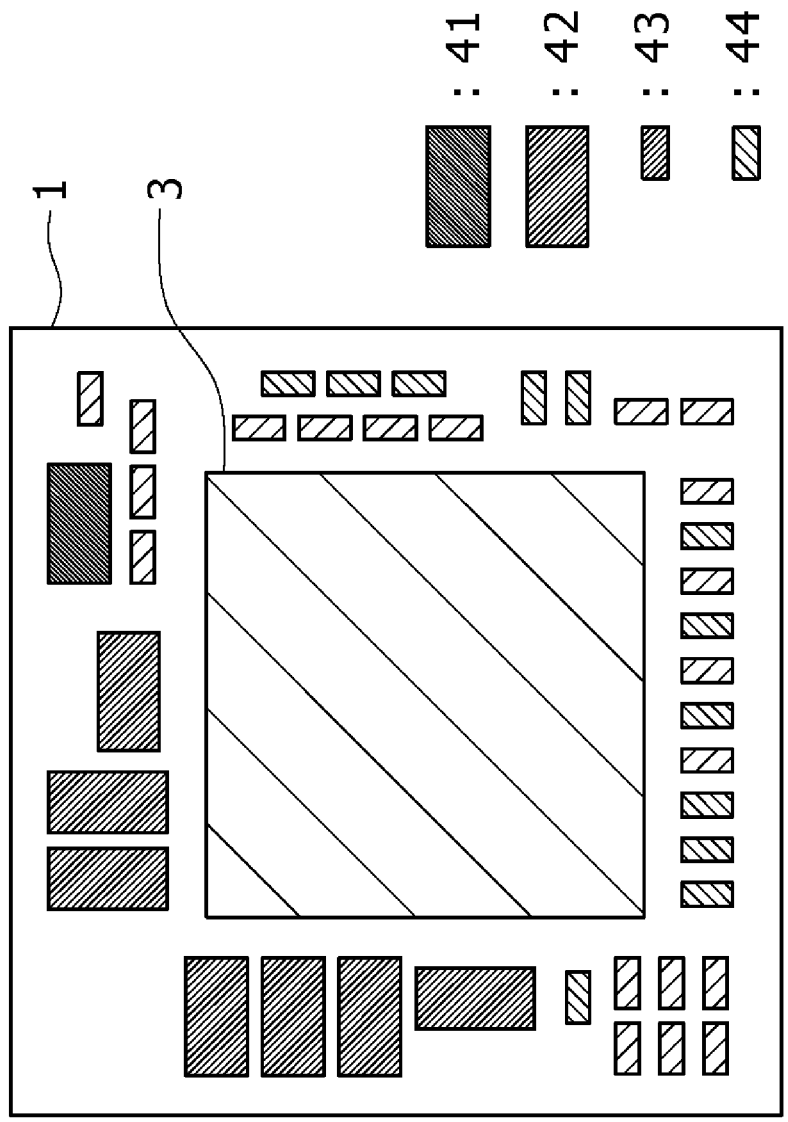
FIG. 1 is a plan diagram showing schematically the general configuration of a silicon tuner module according to an embodiment of the present invention.

Now, an inductor module, a silicon tuner module and a semiconductor device according to embodiments of the present invention will be described below, referring to the drawings.

First of all, the configuration of the silicon tuner module serving as a specific example of the semiconductor device will be described.

Figure 2:
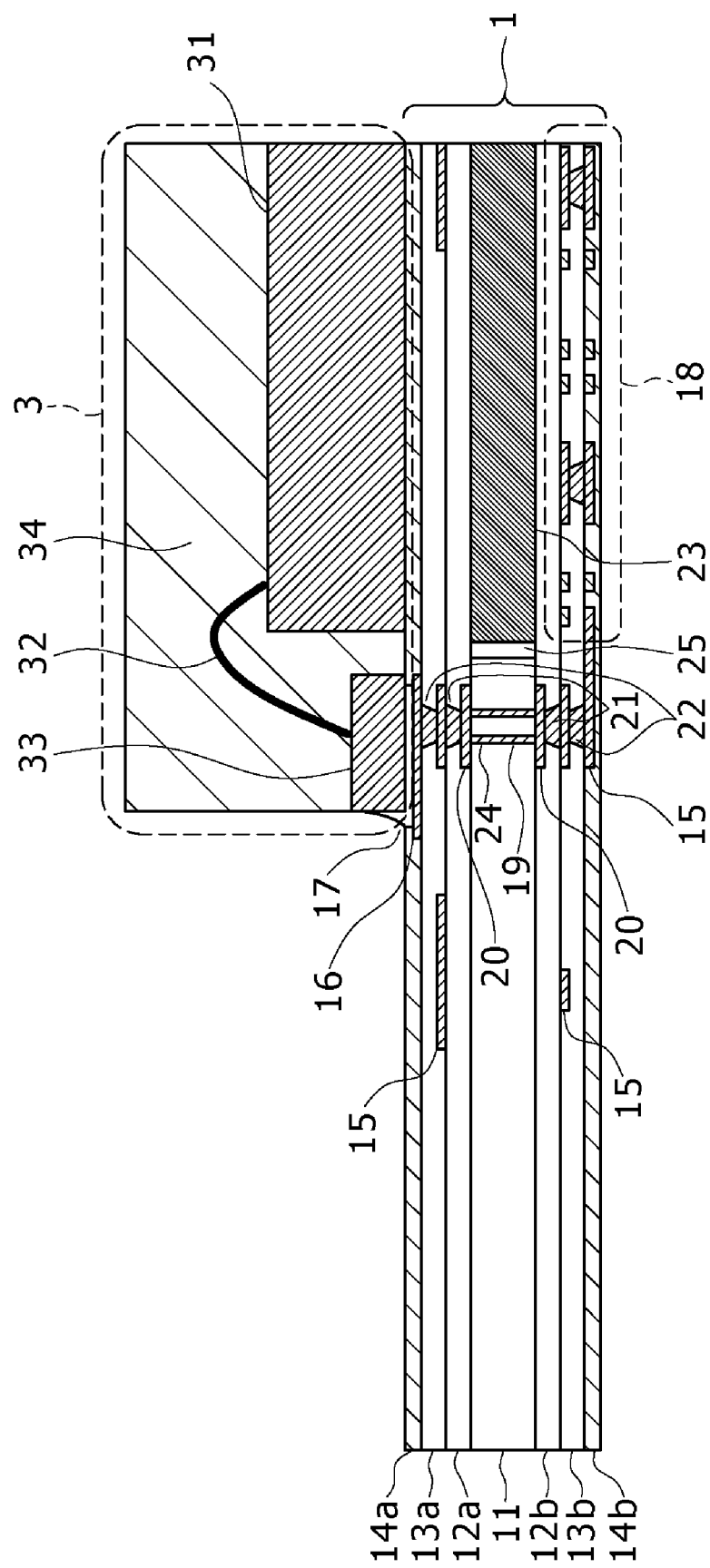
FIG. 2 is a side sectional view showing a configuration example of a major part of the silicon tuner module according to an embodiment of the present invention.

FIG. 1 is a plan diagram schematically showing the general configuration of the silicon tuner module, and FIG. 2 is a side sectional view showing a configuration example of a major part of the same.

The silicon tuner module is for use in the state of being mounted in a television receiver, realizing a function of receiving television broadcasts.

For this purpose, the silicon tuner module includes a silicon tuner IC 3 mounted on a substrate 1, as shown in FIG. 1. Incidentally, on the substrate 1, passive component parts such as a balance-unbalance converter 41, which is an element for conversion of electrical signals being in a balanced state and an unbalanced state, an inductor 42, a capacitor 43 and a resistor 44 may be mounted, in addition to the silicon tuner IC 3.

The silicon tuner IC 3 is an IC having the tuner function for receiving broadcasts, and has integrated therein an analog RF circuit, a VCO circuit, etc. necessary for realizing the tuner function. More specifically, as shown in FIG. 2, a semiconductor IC chip 31 having the analog RF circuit, the VCO circuit and the like integrated therein and a lead frame 33 connected thereto through wire bonding 32 are potted with a resin material 34. Examples of such a silicon tuner IC 3 include so-called VQFN package (very thin quad flat non-leaded package). It should be noted here, however, that the silicon tuner IC 3 is not limited to the VQFN package but may be a silicon tuner IC of other type.

On the other hand, the substrate 1 on which the silicon tuner IC 3 is mounted is one that functions as a printed wiring board, which is a plate-like or film-like part for constituting an electronic circuit, or an interposer, which is a re-wiring substrate for connection of a bare chip with a mother board. It is to be noted here that the substrate 1 functions also as an inductor module according to an embodiment of the present invention, as will be detailed later.

Here, the configuration of the substrate 1 that functions also as an inductor module will be described in detail referring to FIG. 2.

The substrate 1 has a configuration in which a core member 11 of the printed wiring board or interposer, prepregs 12a, 12b, 13a, 13b having a reinforcing glass fabric impregnated with a thermosetting resin, and solder resists 14a, 14b as synthetic resin films (for example, epoxy resin films which are photosensitive and insulating) covering the surfaces are laminated. Incidentally, wirings 15 are formed, as required, at the levels where the prepregs 12a, 12b, 13a, 13b are layered.

On a surface on one side of the substrate 1, a wiring exposed on the surface is formed as an IC mounting part 16. On the IC mounting part 16, the silicon tuner IC 3 is mounted by use of a creamy solder paste 17.

In addition, an inductor 18 is formed in the substrate 1 at such a position as to overlap with the IC mounting part 16 on a plan-view basis. It may be contemplated that the inductor 18 is formed, for example, by winding a copper wire at the level where the prepreg 13b is layered, and there is no limitation as to the form of winding, the number of turns of the winding, or the like.

With the inductor 18 thus formed, the substrate 1 functions as an inductor module.

Further, a copper film 19, copper foils 20 and via electrodes 21, 22 are formed in the substrate 1 in the direction of lamination of the core member 11 and the prepregs 12a, 12b, 13a, 13b. Through these parts, connection between the silicon tuner IC 3 mounted on the IC mounting part 16 and the inductor 18 is secured.

Besides, between the IC mounting part 16 and the inductor 18 in the substrate 1, a magnetic body 23 is disposed at the level where the core member 11 is layered, in such a manner as to replace the core member 11. In other words, in the direction of lamination (stacking) of the layers constituting the substrate 1, the magnetic body 23 is present intermediately between the silicon tuner IC 3 mounted on the IC mounting part 16 and the inductor 18 arranged in the substrate 1. Here, the magnetic body 23 is formed of a magnetic material selected from among a NiZn ferrite, a NiZnCu ferrite and a Ba ferrite. Incidentally, the just-mentioned magnetic materials are all well-known materials and, therefore, detailed description of them is omitted here.

Now, brief description will be made below of manufacturing procedures for the substrate 1 (or the inductor module) configured as above and the silicon tuner module including the substrate 1.

In manufacturing the substrate 1 and the like, first, a through-hole is formed in the core member 11, and a plating treatment, for example, is applied to the through-hole, to form the copper film 19. Then, the portion of the through-hole at which the copper film 19 is not formed is filled with a resin material 24.

Subsequently, the copper foils 20 are adhered respectively to the upper and lower surfaces of the core member 11 in the vicinity of the area where the through-hole is formed. Then, a dry film is subjected to exposure and development, and the copper foils 20 are patterned into predetermined shapes by, for example, wet etching. Then, the dry film is removed.

Thereafter, the portion of the core member 11 in which the magnetic body 23 is to be arranged is removed as a removed part 25, the core member 11 deprived of the removed part 25 is placed on the prepreg 12b, the magnetic body 23 is placed in the area corresponding to the removed part 25, and the prepreg 12a is placed thereon, followed by press molding the resulting assembly.

Further, for example, $CO_2$ laser processing is then conducted to form via holes in the prepregs 12a, 12b, and a via filling plating treatment is carried out, to thereby form the via electrodes 21.

Besides, the wiring 15, the prepregs 13a, 13b, the via electrodes 22, wiring to be the IC mounting part 16, and the inductor 18 are formed, in substantially the same procedure as above.

Then, the solder resists 14a, 14b are formed, and an opening part of the solder resist 14a is subjected to a Ni/Au plating treatment and coated with the creamy solder paste 17.

Finally, the silicon tuner IC 3 as a VQFN package is mounted on the creamy solder paste 17, followed by a solder reflow treatment.

Through the above-mentioned procedure, the inductor module and the silicon tuner module are completed.

Now, description will be made below of the operational advantages of the inductor module and the silicon tuner module which are configured as above.

In the inductor module configured as above, the inductor 18 is formed in the substrate 1 at such a position as to overlap with the IC mounting part 16 on a plan-view basis. Therefore, the laying-around distances of the wirings 15, 16, the copper film 19, the copper foils 20, the via electrodes 21, 22, etc. for securing connection between the inductor 18 and the silicon tuner IC 3 can be made shorter than in the case where the inductor 18 is formed on the substrate 1 as an externally attached part. Therefore, it is possible to prevent parasitic resistance, parasitic capacitance, parasitic inductance, etc. arising from the laying-around distances of the wirings and the like from exerting bad influences on the characteristics of the inductor 18. As a result, it is possible to really suppress degradation of the characteristics of the inductor 18.

Besides, in the inductor module configured as above, although the inductor 18 is formed at such a position as to overlap with the IC mounting part 16 on a plan-view basis, the magnetic body 23 is provided intermediately between the IC mounting part 16 and the inductor 18 and, hence, the unwanted radiation from the silicon tuner IC 3 mounted on the IC mounting part 16 is absorbed by the electromagnetic wave absorbing action of the magnetic body 23. Consequently, the adverse effects of the unwanted radiation are restrained from being exerted on the inductor 18. Moreover, since the body present intermediately between the IC mounting part 16 and the inductor 18 is the magnetic body 23, an L value amplifying action of the magnetic body 23 on the inductor 18 can also be expected.

Thus, by configuring the inductor as above-mentioned, the laying-around distances of the parts for securing connection between the inductor 18 and the silicon tuner IC 3 can be shortened. Moreover, degradation of inductor characteristics due to influences of the radiation of harmonics from the VCO circuit, etc. of the silicon tuner IC 3 can be lessened by the simple configuration in which the magnetic body 23 is arranged intermediately between the silicon tuner IC 3 and the inductor 18.

Here, description will be made of the mechanism by which radiation of harmonics can be restrained when the magnetic body 23 is present intermediately between the silicon tuner IC 3 and the inductor 18.

Radiation of harmonics occurs, from a part suitable for the radiation, when an unwanted high-frequency current is produced in a circuit. For example, harmonics may be radiated from an inductor in the VCO circuit of the silicon tuner IC 3.

On the other hand, the magnetic body 23 acts as a resistive impedance against the circuit in which the high-frequency current is generated, thereby eliminating the high-frequency current itself.

Therefore, where the magnetic body 23 is present intermediately between the silicon tuner IC 3 and the inductor 18, the high-frequency current as a cause of radiation of harmonics is removed by a magnetic loss (or the resistive impedance) appearing only in response to high-frequency waves; specifically, the current is converted into heat. As a result, the radiation of harmonics is suppressed.

It is to be noted here that such an electromagnetic wave absorbing action of the magnetic body 23 is displayed through utilization of the characteristics of the imaginary part ($\mu''$) of the complex permeability of the magnetic body 23.

Figure 3:
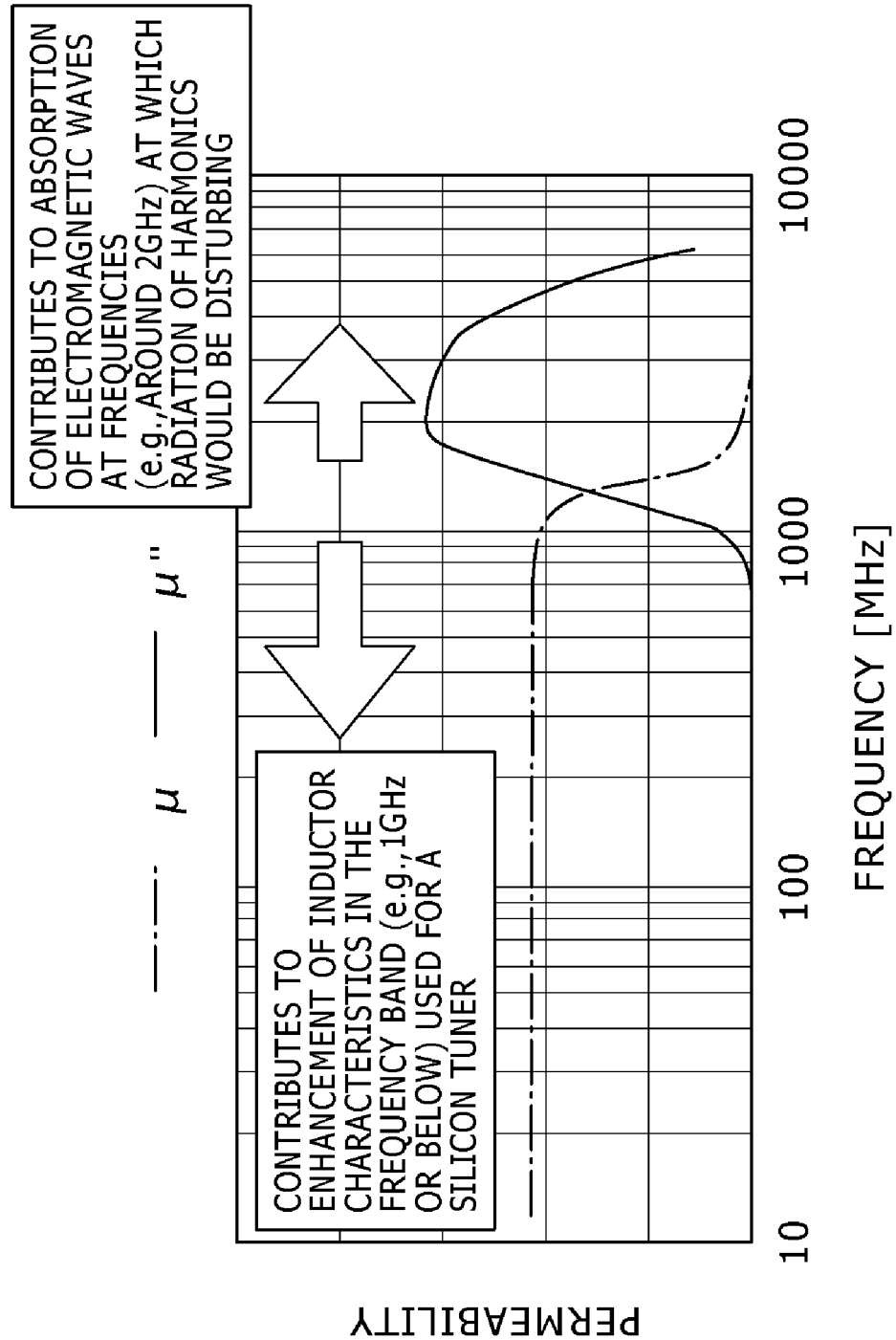
FIG. 3 illustrates a specific example of magnetic characteristic of a magnetic body.

FIG. 3 is an illustration of a specific example of magnetic characteristic of a magnetic body, showing the frequency dependence of complex permeability.

As exemplified in the figure, it is known that the complex permeability of a magnetic body 23 has a real part ($\mu'$) and an imaginary part ($\mu''$).

The suppression by the magnetic body 23 of the radiation of harmonics occurs starting from the frequency at which the curve of $\mu''$ (magnetic loss) rises up. In the frequency band below this frequency, the magnetic body 23 contributes to enhancement of the inductance (L value) of the inductor 18 by the effect of $\mu'$.

This means that, in order to achieve suppression by the magnetic body 23 of the radiation of harmonics, the $\mu'$ and $\mu''$ characteristics of the magnetic body 23 have to be matched to the frequency band used for the IC from which the harmonics are radiated. Specifically, for the silicon tuner IC 3, such a setting is adopted that the magnetic body 23 can contribute to enhancing the L value of the inductor 18 through the effect of its $\mu'$ characteristic at frequencies below 1 GHz which is used for the tuner, and that the magnetic body 23 can contribute to suppressing the radiation of harmonics from the silicon tuner IC 3 through the effect of its $\mu''$ characteristic.

Examples of the magnetic material which can realize such magnetic characteristics include NiZn ferrites, NiZnCu ferrites and Ba ferrites. That is, when a magnetic material selected from among a NiZn ferrite, a NiZnCu ferrite and a Ba ferrite is used as the magnetic body 23, utilization of its $\mu'$ characteristic in the frequency band used for the silicon tuner IC 3 and utilization of its $\mu''$ characteristic in the frequency band where the unwanted radiation might produce a problem can both be realized. Specifically, in the frequency band used for the silicon tuner IC 3 (for example, from several tens of megahertz to a little less than 1 GHz), the L value amplifying action can be exhibited through utilization of the µ' characteristic of the magnetic body 23. Besides, in the frequency band where the radiation of harmonics from the VCO circuit 5 of the silicon tuner IC 3 would produce a problem (for example, around 2 GHz), the electromagnetic wave absorbing action can be displayed through utilization of the µ" characteristic of the magnetic body 23.

Incidentally, while a preferred embodiment of the present invention has been described above, the invention is not limited to or by the contents of the above description, and modifications may be made, as required, within the scope of the gist of the invention.

For instance, while the case where the embodiments of the present invention are applied to a silicon module serving as a specific example of a semiconductor device has been taken in the present embodiment, the invention is applicable in the same manner to any other semiconductor device that has a configuration wherein an IC having the function as a semiconductor integrated circuit is mounted on an IC mounting part of a substrate. In other words, even in the other semiconductor devices, provision of the magnetic body intermediately between the IC mounting part and the inductor ensures that bad influences of the unwanted radiation from the IC can be restrained while precluding the adverse effects of parasitic resistance, parasitic capacitance, parasitic inductance, etc.

The present application contains subject matter related to that disclosed in Japanese Priority Patent Application JP 2008-153758 filed in the Japan Patent Office on Jun. 12, 2008, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. An inductor module comprising:
a substrate functioning as a printed wiring board or an interposer;
an integrated circuit mounting part formed on a surface of said substrate;
an inductor which is formed in said substrate at such a position as to overlap with said integrated circuit mounting part on a plan-view basis and which is connected to an integrated circuit mounted on said integrated circuit mounting part; and
a magnetic body including a magnetic material selected from among a NiZn ferrite, a NiZnCu ferrite and a Ba ferrite, said magnetic body being disposed intermediately between said integrated circuit mounting part and said inductor,
wherein,
a real part and an imaginary part of a permeability characteristic of the magnetic body respectively match an operating frequency range of the integrated circuit so as to amplify an L value of the inductor and a frequency range outside of the operating frequency range of the integrated circuit so as to suppress radiation of harmonics from the integrated circuit.

2. A silicon tuner module comprising:
a silicon tuner integrated circuit having a tuner function for receiving broadcasts;
a substrate functioning as a printed wiring board or an interposer;
an integrated circuit mounting part formed on a surface of said substrate so as to mount said silicon tuner integrated circuit;
an inductor which is formed in said substrate at such a position as to overlap with said integrated circuit mounting part on a plan-view basis and which is connected to said silicon tuner integrated circuit mounted on said integrated circuit mounting part; and
a magnetic body including a magnetic material selected from among a NiZn ferrite, a NiZnCu ferrite and a Ba ferrite, said magnetic body being disposed intermediately between said integrated circuit mounting part and said inductor,
wherein,
a real part and an imaginary part of a permeability characteristic of the magnetic body respectively match an operating frequency range of the integrated circuit so as to amplify an L value of the inductor and a frequency range outside of the operating frequency range of the integrated circuit so as to suppress radiation of harmonics from the integrated circuit.

3. A semiconductor device comprising:
an integrated circuit having a function as a semiconductor integrated circuit;
a substrate functioning as a printed wiring board or an interposer;
an integrated circuit mounting part formed on a surface of said substrate so as to mount said integrated circuit;
an inductor which is formed in said substrate at such a position as to overlap with said integrated circuit mounting part on a plan-view basis and which is connected to said integrated circuit mounted on said integrated circuit mounting part; and
a magnetic body including a magnetic material selected from among a NiZn ferrite, a NiZnCu ferrite and a Ba ferrite, said magnetic body being disposed intermediately between said integrated circuit mounting part and said inductor,
wherein,
a real part and an imaginary part of a permeability characteristic of the magnetic body respectively match an operating frequency range of the integrated circuit so as to amplify an L value of the inductor and a frequency range outside of the operating frequency range of the integrated circuit so as to suppress radiation of harmonics from the integrated circuit.

* * * * *